United States Patent [19]
Niioka

[11] Patent Number: 5,198,290
[45] Date of Patent: Mar. 30, 1993

[54] ELECTROMAGNETIC WAVE SHIELDING MATERIAL

[75] Inventor: Yoshio Niioka, 40, Oaza-kunotsuboyama, Nishiharu-cho, Nishikasugai-gun, Aichi, Japan

[73] Assignees: Yoshio Niioka, Aichi, Japan; Marvin Gottlieb, Ill.

[21] Appl. No.: 614,265

[22] Filed: Nov. 14, 1990

[30] Foreign Application Priority Data

Nov. 14, 1989 [JP] Japan .................................. 1-296746

[51] Int. Cl.⁵ ........................ B32B 15/00; B32B 7/00; B27N 9/00; H05K 9/00
[52] U.S. Cl. .................................. 428/263; 428/242; 428/251; 428/285; 428/920; 174/35 MS; 324/424
[58] Field of Search .................. 428/242, 251, 263, 91, 428/285, 920; 174/35 MS; 324/424

[56] References Cited

U.S. PATENT DOCUMENTS

| | | | |
|---|---|---|---|
| 3,055,768 | 9/1962 | Lassiter | 428/334 X |
| 3,086,879 | 4/1963 | Lassiter | 428/263 X |
| 4,375,493 | 3/1983 | George et al. | 428/251 X |
| 4,401,707 | 8/1983 | Bailey et al. | 428/283 X |
| 4,435,465 | 3/1984 | Ebneth et al. | 428/242 X |
| 4,785,136 | 11/1988 | Mollet et al. | 174/35 MS X |
| 4,808,465 | 2/1989 | Vane | 428/233 |
| 4,913,978 | 4/1990 | Klotz et al. | 428/263 X |
| 4,980,564 | 12/1990 | Steelman | 428/242 X |

FOREIGN PATENT DOCUMENTS 3249775 10/1988 Japan .................................. 428/263

Primary Examiner—George F. Lesmes
Assistant Examiner—Terrel Morris
Attorney, Agent, or Firm—Koda & Androlia

[57] ABSTRACT

Disclosed is an electromagnetic wave shielding material comprising a flexible base fabric, a first metallic film formed by flame-spraying a metal such as zinc on one side of said base fabric and a second metallic film such as an aluminum foil formed on the other side of said base fabric; said first metallic film does not peel after long lapse of time and can provide sufficient shielding effect to be used in unechoic chambers etc.

2 Claims, 5 Drawing Sheets

ELECTROMAGNETIC WAVE SHIELDING MATERIAL

BACKGROUND OF THE INVENTION

This invention relates to an electromagnetic wave shielding material which can effectively prevent radiation or intrusion of electromagnetic waves therethrough.

Precision electronic appliances including computers often suffer wave interference to malfunction and runaway in response to external electromagnetic waves such as impulsive noises. As a preventive measure for such wave interference, it has been suggested to form a shielding film on the internal wall surfaces of the resin cases of these electric appliances including computers by applying a nickel coating or one containing carbon or a metal powder in order to impart electric conductivity to said wall surfaces.

However, in the above method, the internal surface of such resin case comprising a molded product made of plastic and the like is found to have considerable roughness by microscopic observation, so that the shielding film can be formed only thinly especially at those portions with radii and on the rising faces, making it generally very difficult to form a uniform film over the entire internal surface of the case. Accordingly, if the formed shielding film is too thin, sufficient shielding effect may not be obtained. Further, the shielding coating may peel during a long period and the peeled metallic debris may drop on the IC substrate to cause drop in insulating properties, causing malfunction in the electronic appliances.

SUMMARY OF THE INVENTION

Therefore, it is an object of this invention to provide an electromagnetic wave shielding material which does not suffer peeling in the metallic film after long lapse of time and can provide sufficient shielding effect.

More specifically, the gist of this invention resides in an electromagnetic wave shielding material comprising a flexible ground fabric, a first metallic film formed by flame spraying on one side of said ground fabric and a second metallic film formed on the other side of said base fabric.

DETAILED DESCRIPTION OF PREFERRED EMBODIMENTS

Figure 1:
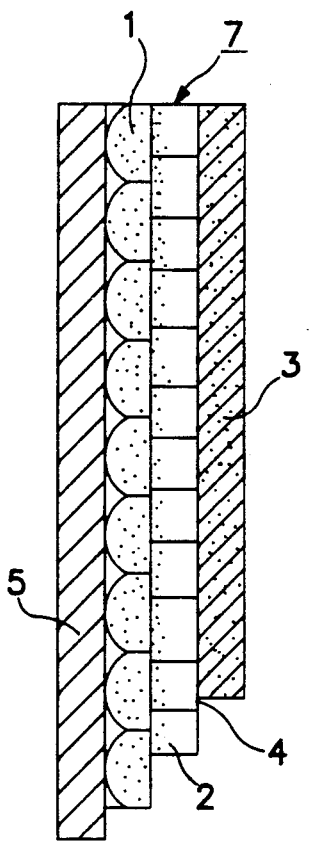
FIG. 1 is a cross-sectional view of the electromagnetic wave shielding material according to a first embodiment of this invention.

Next, the electromagnetic wave shielding material according to this invention will be described by way of a preferred embodiment referring to the attached drawings. In FIG. 1 the reference numeral 2 shows a flexible base fabric, such as glass cloth, carbon cloth and Kevlar cloth, having a first metallic film 1 on one side thereof. The first metallic film 1 can suitably be formed on one side of the base fabric 2, for example, by zinc flame-spraying. The flexible base fabric 2 has a second metallic film 3, for example, of an aluminum foil bonded with a suitable adhesive 4 on the other surface thereof. Incidentally, depending on the application, a wall decorative sheet 5 comprising, for example, a vinyl sheet may be bonded on the first metallic film 1.

Figure 2:
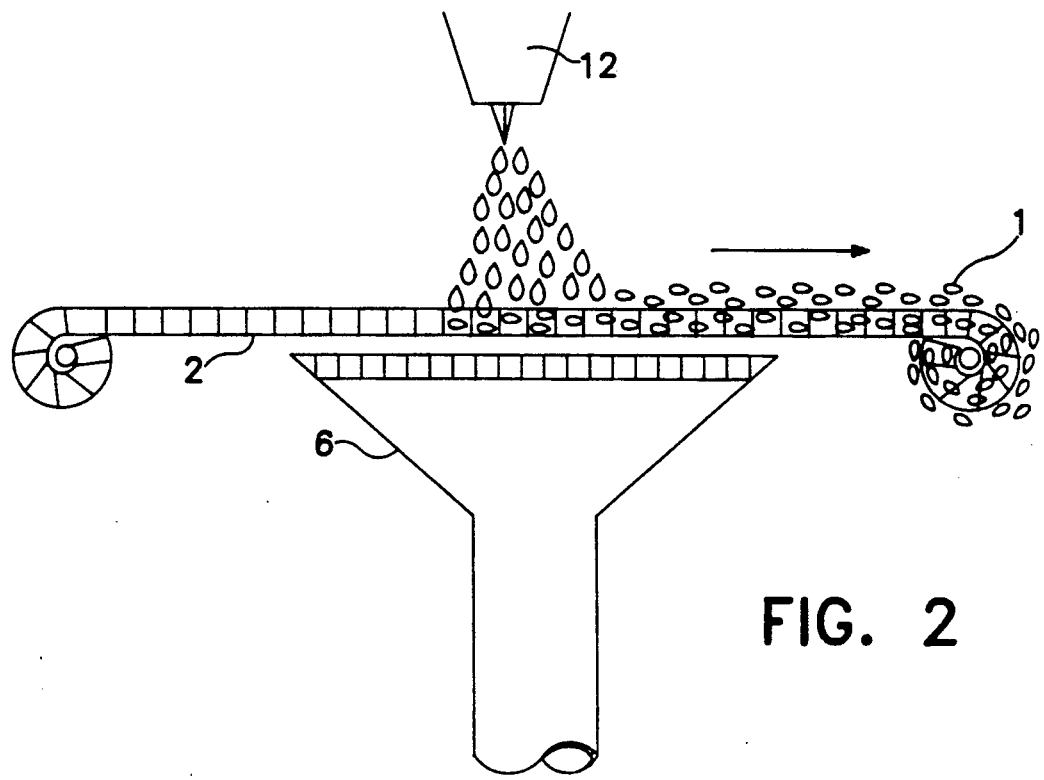
FIG. 2 illustrates a method of forming a metallic film on one side of the flexible base fabric by flame-spraying.

FIG. 2 shows an example of forming the first metallic film 1 on the flexible base fabric 2. To describe specifically zinc flame spraying to the flexible base fabric 2, a base fabric 2 to be subjected to metal flame spraying treatment is forwarded over an aspirator 6 by winding said fabric 2 while the base fabric 2 is occasionally fed back a little by winding it, and fused zinc is sprayed, for example, through a nozzle 12 down to the flexible base fabric 2 passing immediately above the aspirator 6.

As described above, by forming the first metallic film 1 by flame-spraying zinc on one side of the flexible base fabric 2 and an aluminum foil as the second metallic film 3 on the other side thereof, a sheet form of electromagnetic wave shielding material 7 can be obtained. The thus obtained electromagnetic wave shielding material 7 can be installed by adhering the second metallic film 3, for example, onto the internal wall surface of a chamber which is to be protected from wave interference and provides the following effects.

(1) Mechanical properties

In this invention, the first metallic film 1 (hereinafter sometimes referred simply to as metallic film) of the electromagnetic wave shielding material 7 is designed to be formed by flame-spraying a metal. Accordingly, ultrafine particles of the fused metal penetrate into the flexible base fabric 2 to be deposited thereon continuously with said particles being partially oxidized, so that a considerably high degree of bond strength can be achieved between the base fabric 2 and the first metallic film 1, and said metal film 1 never peels with passage of time even if there is a difference between the expansion coefficient of the base fabric 2 and that of the first metallic film 1. On the other hand, if the first metallic film 1 is formed by vacuum vapor deposition, spot-like peeling occurs in the deposited film because the bond between the deposited film and the flexible ground fabric is rather achieved on the surface region and due to the difference between the expansion coefficient of the metal film and that of the base fabric.

(2) Electrical properties

In this invention, the first metallic film 1 of the electromagnetic wave shielding material 7 is designed to be formed by flame-spraying a metal, as described above. Accordingly, depth of the sprayed metal penetrating into the base fabric 2 and density thereof can suitably be varied corresponding to the material or shape of the base fabric 2 and to the frequency of the electromagnetic wave to be shielded. Moreover, since the metallic film 1 not only has a very rough surface formed by flame spraying to be able to absorb the external electromagnetic waves arriving thereto, but also assumes a form of metal oxide (e.g. a film of zinc oxide), and besides if some of the electromagnetic waves should penetrate through the first metallic film 1, they can be reflected back on the second metallic film 3, the electromagnetic wave shielding material 7 of this invention has a screening effect of reflecting the electromagnetic waves thereon as magnetic wave shielding material 7 can directly be used in an unechoic chamber as an electromagnetic wave shielding sheet, for example, for shielding electromagnetic waves of 60 to 70 dB, provided that the frequency is 10 to 100 MHz.

It should be noted, however, that if the first metallic film 1 is formed by vacuum vapor deposition, the thus formed film assumes a form of metal film having a smooth surface, so that the electromagnetic waves are reflected on the flat surface and cannot be absorbed thereby. Accordingly, when an electromagnetic wave generator and a receiver are installed in an unechoic chamber, the receiver is absolutely subject to the influence of the reflected electromagnetic waves.

Figure 3:
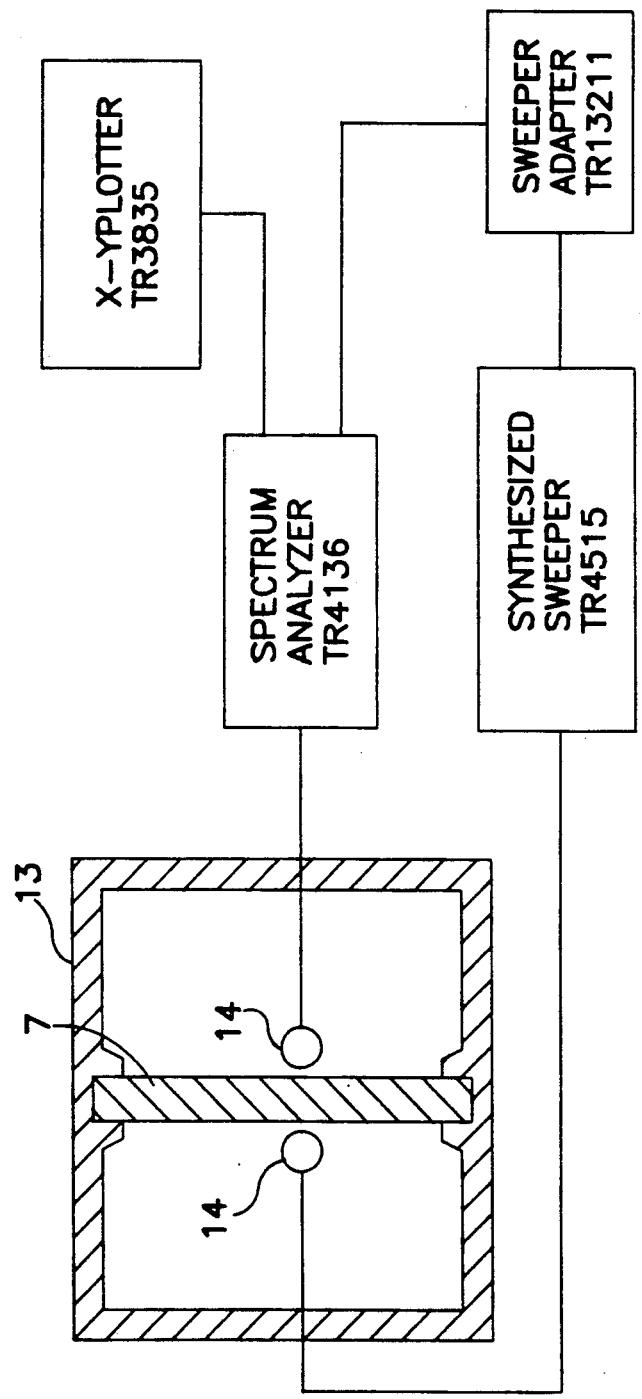
FIG. 3 shows a block chart of testers for determining properties of the electromagnetic wave shielding material according to this invention.
Figure 4:
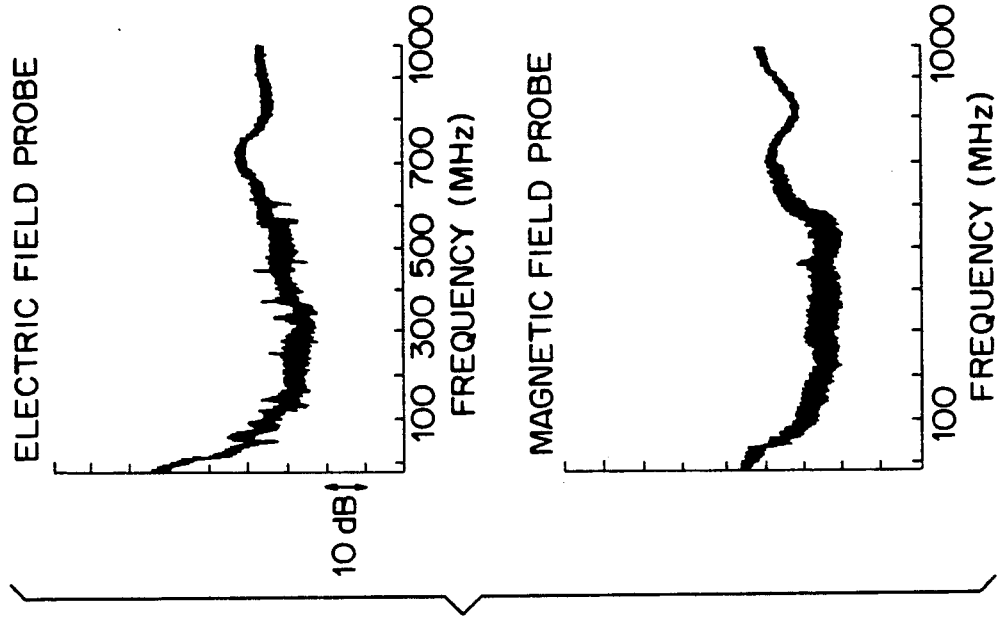
FIG. 4 shows characteristic curves of an electromagnetic wave shielding material having a first metallic film formed by flame spraying on one side of the flexible ground fabric with no second metallic film on the other side thereof.
Figure 5:
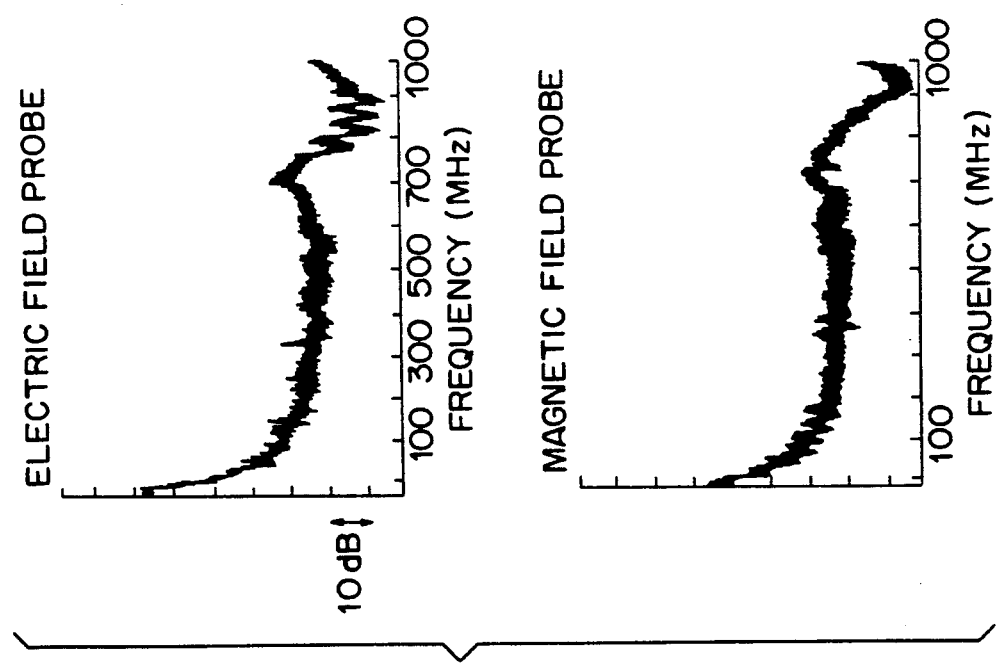
FIG. 5 shows characteristic curves of an electromagnetic wave shielding material having a first metallic film formed by flame spraying on one side of the flexible ground fabric and a second metallic film formed on the other side thereof.

Now, electromagnetic wave shielding properties of the electromagnetic wave shielding material 7 were determined as shown in FIG. 3. To describe in detail, an electromagnetic wave shielding material 7 according to this invention was disposed upright at the center of a shielding box 13 and a pair of antenna magnetic fields 14 were provided on each side of said shielding material 7 to carry out determination using testers manufactured by ADVANTEST CORPORATION. Incidentally, for the purpose of comparison, an electromagnetic wave shielding material comprising a base fabric 2 having the first metallic film 1 only (control) was subjected to determination. Test results for the electromagnetic wave shielding material 7 of this invention comprising the flexible base fabric 2 having the first metallic film 1 and the second metallic film 3 on each side thereof are shown in FIG. 5; whereas those for the control electromagnetic wave shielding material are shown in FIG. 4. Consequently, it was found that the electromagnetic wave shielding material 7 according to this invention shown in FIG. 5 has improved electromagnetic wave shielding property by 10 to 20% compared with the control shown in FIG. 4.

Figure 6:
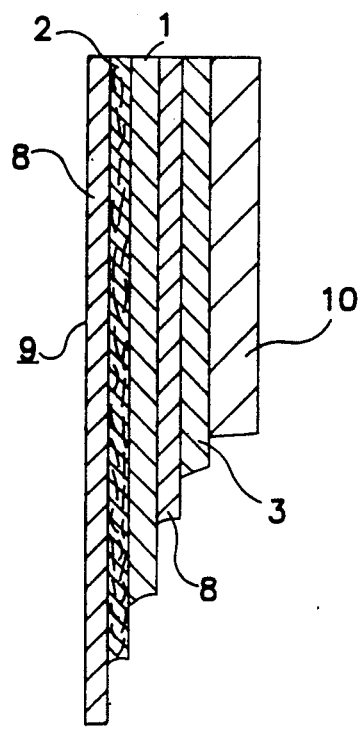
FIG. 6 is a vertical cross section of the electromagnetic wave shielding material according to another embodiment of this invention.

Next, as shown in FIG. 6, a first metallic film 1 was formed by flame spraying on one side of a flexible base fabric 2. Then a pair of sound insulation members 8 made of, for example, felt were bonded on the first metallic film 1 as well as on the other side of the base fabric 2. A metal foil or lead plate was further bonded onto one of the pair of sound insulation members 8 as the second metallic film 3 to complete an electromagnetic wave shielding material 9. By bonding the electromagnetic wave shielding material 9 on the internal wall surface 10 of a plastic housing of an electronic appliance such as a computer and chambers, it can function as a sound insulating, electromagnetic wave shielding and earsdropping preventing material.

Figure 7:
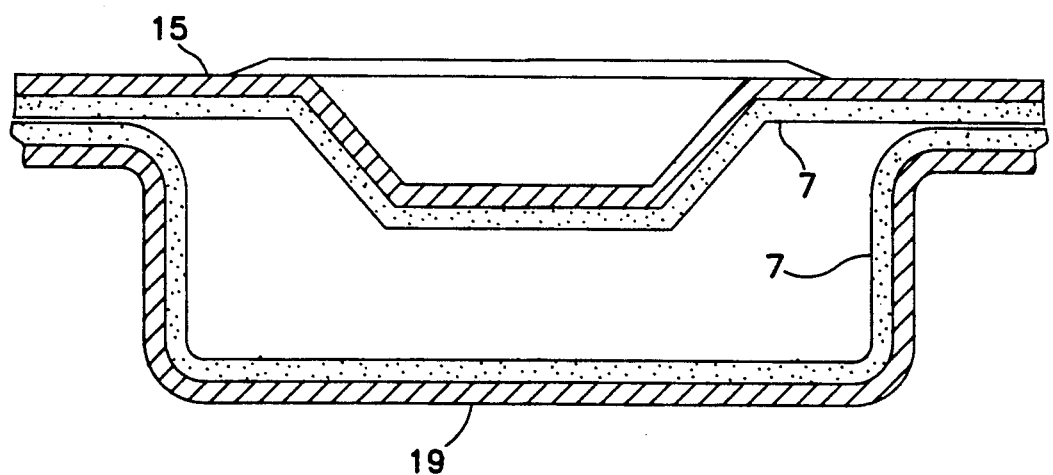
FIG. 7 is a cross section of an instrument cover and a case on which the electromagnetic wave shielding material according to this invention is applied.
Figure 8:
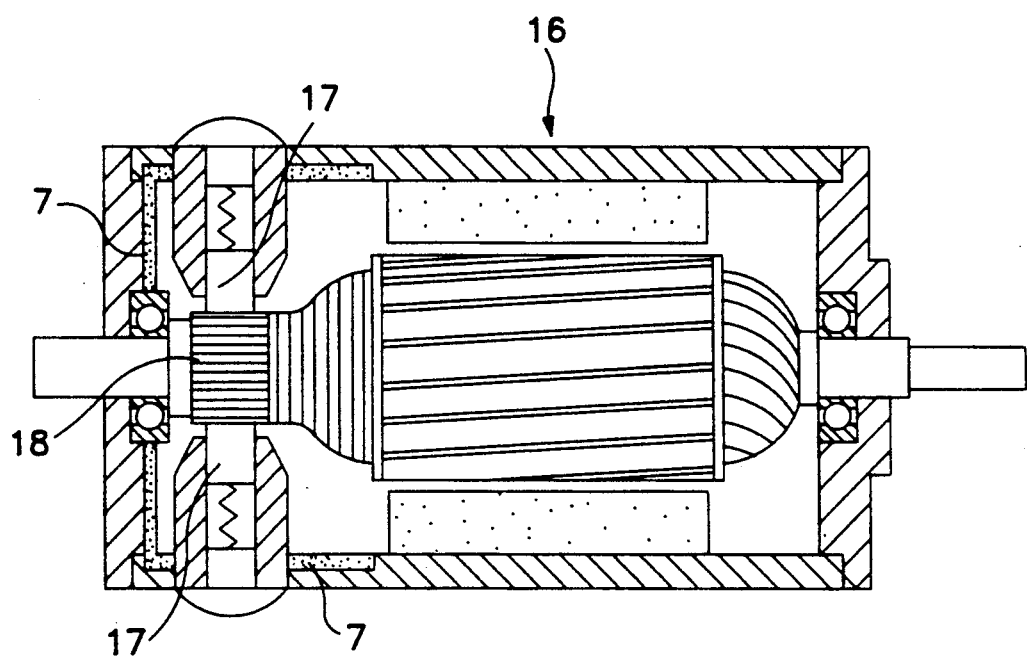
FIG. 8 shows, in cross section, an example where the electromagnetic wave shielding material according to this invention is applied to a motor.

The electromagnetic wave shielding material 7 can be press-molded into desired shapes of products by coating said member 7 with a plastic. In such press-molding, the electromagnetic wave shielding material 7 can be molded and applied on the inner surfaces of the instrument cover 15 and the case 19 for mounting a computer, as shown in FIG. 7, to effectively prevent malfunction of the computer to be caused by the external electromagnetic waves. Further, in a motor 16 of a type where power is fed through a brush 17 and a rectifier 18 as shown in FIG. 8, noise waves to be generated during rotation of the motor can effectively be prevented from radiated externally by surrounding the periphery adjacent to the brush 17 with the electromagnetic wave shielding material 7.

The electromagnetic wave shielding material according to this invention undergoes small change with time compared with those formed by vacuum vapor deposition, and thus the problem that metallic debris of the electromagnetic wave shielding sheet drop on the electric circuit of the computer during passage of time which has long been suffered can successfully be solved thereby. Besides, the electromagnetic wave shielding material of this invention has a filtering effect of absorbing electromagnetic waves as well as shielding them.

What is claimed is:

1. An electromagnetic wave shielding material comprising:
    a flexible base fabric made of glass cloth;
    a first metallic film made of zinc formed on one side of said base fabric by flame spraying;
    felt sound insulation members provided on an other side of said base fabric and on an outer surface of said first metallic film, respectively; and
    a second metallic film member made of a metal selected from the group consisting of foil and lead plate bonded on an outer surface of the sound insulation member provided on said first metallic film.

2. The electromagnetic wave shielding material according to claim 1, wherein the second metallic film is an aluminum foil.

* * * * *